(12) United States Patent
Lan et al.

(10) Patent No.: US 12,395,152 B2
(45) Date of Patent: Aug. 19, 2025

(54) COMPACT HYBRID ACOUSTIC WAVE FILTER STRUCTURE

(71) Applicant: QUALCOMM Incorporated, San Diego, CA (US)

(72) Inventors: Je-Hsiung Lan, San Diego, CA (US); Jonghae Kim, San Diego, CA (US); Nosun Park, San Diego, CA (US); Jui-Yi Chiu, Taichung (TW); Kai Liu, Phoenix, AZ (US)

(73) Assignee: QUALCOMM INCORPORATED, San Diego, CA (US)

( * ) Notice: Subject to any disclaimer, the term of this patent is extended or adjusted under 35 U.S.C. 154(b) by 348 days.

(21) Appl. No.: 18/160,917

(22) Filed: Jan. 27, 2023

(65) Prior Publication Data

US 2024/0258995 A1 Aug. 1, 2024

(51) Int. Cl.
*H03H 9/54* (2006.01)
*H03H 3/02* (2006.01)
(Continued)

(52) U.S. Cl.
CPC .............. *H03H 9/542* (2013.01); *H03H 3/02* (2013.01); *H03H 3/08* (2013.01); *H03H 9/0557* (2013.01);
(Continued)

(58) Field of Classification Search
CPC ............ H03H 9/542; H03H 3/02; H03H 3/08; H03H 9/171; H03H 9/25; H03H 9/64;
(Continued)

(56) References Cited

U.S. PATENT DOCUMENTS

2013/0071969 A1\* 3/2013 Vodrahalli .............. H01L 24/17
 438/107
2017/0141756 A1 5/2017 Yun et al.
(Continued)

FOREIGN PATENT DOCUMENTS

WO 2019132926 A1 7/2019

OTHER PUBLICATIONS

Hsieh S-C., et al., "High-Q 3D-IPD Diplexer with High Aspect Ratio Cu Pillar Inductor", 2018, 7th Electronic System-integration Technology Conference, (ESTC), IEEE, Sep. 18, 2018, 5 Pages, XP033452885, III. Process Overview, p. 2, right-hand column, figures 3, 4.
(Continued)

*Primary Examiner* — Jorge L Salazar, Jr.
(74) *Attorney, Agent, or Firm* — Muncy, Geissler, Olds & Lowe, P.C.

(57) ABSTRACT

A compact, hybrid, acoustic wave filter structure is disclosed. In an aspect an apparatus comprises a substrate; a first, multi-layer metallization structure disposed above the substrate; a plurality of pillar structures disposed above, and electrically coupled to, the first metallization structure; a second metallization structure disposed above, an electrically coupled to, the plurality of pillar structures. An acoustic unit (AU) is disposed between the first and second metallization structures and adjacent to at least one of the pillar structures. The AU comprises a surface acoustic wave or bulk acoustic wave acoustic resonator that is electrically coupled to a capacitor and an inductor. The capacitor comprises a metal-insulation-metal capacitor that is formed from a portion of the first metallization structure and optionally also from at least one pillar structure and a portion of the second metallization structure. The inductor is comprised of a second portion of the first metallization structure.

25 Claims, 18 Drawing Sheets

(51) Int. Cl.
| | |
|---|---|
| *H03H 3/08* | (2006.01) |
| *H03H 9/05* | (2006.01) |
| *H03H 9/17* | (2006.01) |
| *H03H 9/25* | (2006.01) |
| *H03H 9/64* | (2006.01) |
| *H10D 1/68* | (2025.01) |

(52) U.S. Cl.
CPC .............. *H03H 9/171* (2013.01); *H03H 9/25* (2013.01); *H03H 9/64* (2013.01); *H10D 1/68* (2025.01)

(58) Field of Classification Search
CPC .... H03H 9/0523; H03H 9/059; H03H 9/1007; H03H 9/1064; H03H 9/0557; H10D 1/68
USPC .................. 333/133, 186–188, 193–196
See application file for complete search history.

(56) References Cited

U.S. PATENT DOCUMENTS

| | | | |
|---|---|---|---|
| 2018/0033737 A1* | 2/2018 | Kuhlman | ............... H01L 23/60 |
| 2020/0076405 A1 | 3/2020 | Liu et al. | |
| 2021/0257988 A1* | 8/2021 | Tseng | ....................... H03H 9/08 |
| 2021/0398957 A1 | 12/2021 | Lan et al. | |

OTHER PUBLICATIONS

International Search Report and Written Opinion—PCT/US2024/011362—ISA/EPO—Jun. 6, 2024.
Zhurbenko V., "Thin-Film-Based Passive Integration Technology," In: "Advanced Microwave Circuits and Systems", 2010, DTU, XP055651872, pp. 263-269, 2.3 Thin-Film-Based Passive Integration Technology; p. 263-p. 264, figure 2.4.

\* cited by examiner

COMPACT HYBRID ACOUSTIC WAVE FILTER STRUCTURE

BACKGROUND OF THE DISCLOSURE

1. Field of the Disclosure

This disclosure relates generally to acoustic wave filters, and more specifically, but not exclusively, to compact, hybrid, acoustic wave filter structures.

2. Description of the Related Art

Surface acoustic wave (SAW) and bulk acoustic wave (BAW) filters are devices which make use of the properties of piezoelectric material to convert electrical signals to acoustic waves and back to electrical signals, and are thus commonly referred to as "acoustic devices" or "acoustic wave devices." The dimensions of the piezoelectric substrate can be tuned such that specific frequencies are allowed or blocked, making acoustic devices ideal radio frequency (RF) filters.

FIG. 1 a side view of an apparatus 100 that includes a conventional implementation of a BAW filter. The apparatus 100 shown in FIG. 1 includes a substrate 102, upon which is mounted a flip-chip BAW acoustic unit (AU) 104, to which may be mounted one or more BAW(s) 106. The BAW filter uses an LC circuit comprised of a surface mount technology (SMT) capacitor 108 and an SMT inductor 110, both of which are surface mounted to the substrate 102 and electrically connected to the BAW AU 104 via metal traces on the substrate, some of which form pads to which the BAW AU 104 is mounted via a ball or pillar contact.

The conventional implementation of a BAW filter illustrated in FIG. 1 has several disadvantages. For example, there are long conductive paths to from the BAW 106 to the LC components, such as path 112 and path 114. Because of these long paths, it is not feasible to shape or tune the BAW response by the SMT capacitor 108 and the SMT inductor 110. Another disadvantage is that the BAW AU 104, SMT capacitor 108, and SMT inductor 110 take up valuable space on the substrate 102.

Thus, there is a need for a better approach having none of the disadvantages described above.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus comprising: a substrate; a first metallization structure disposed above the substrate, the first metallization structure comprising a plurality of metal layers; a plurality of pillar structures disposed above the first metallization structure and electrically coupled to the first metallization structure; a second metallization structure disposed above the plurality of pillar structures and electrically coupled to the plurality of pillar structures; and an acoustic unit (AU) disposed above the first metallization structure, below the second metallization structure, and adjacent to at least one of the pillar structures, the AU comprising a surface acoustic wave (SAW) or bulk acoustic wave (BAW) acoustic resonator (AR) that is electrically coupled to a capacitor and an inductor, wherein the capacitor comprises a metal-insulation-metal (MIM) capacitor that is comprised of a first portion of the first metallization structure, and wherein the inductor is comprised of a second portion of the first metallization structure.

In an aspect, a method for fabricating an apparatus includes: providing a substrate; forming, on the substrate, a first metallization structure comprising a MIM capacitor; forming a plurality of pillar structures disposed above the first metallization structure and electrically coupled to the first metallization structure; attaching an AU above and electrically coupled to the first metallization structure and adjacent to at least one of the pillar structures, the AU comprising a SAW or BAW AR that is electrically coupled to the MIM capacitor and an inductor; and forming a second metallization structure disposed above the plurality of pillar structures and electrically coupled to the plurality of pillar structures, wherein the inductor is comprised of a second portion of the first metallization structure.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein like reference numbers represent like parts, which are presented solely for illustration and not limitation of the disclosure.

Figure 1:
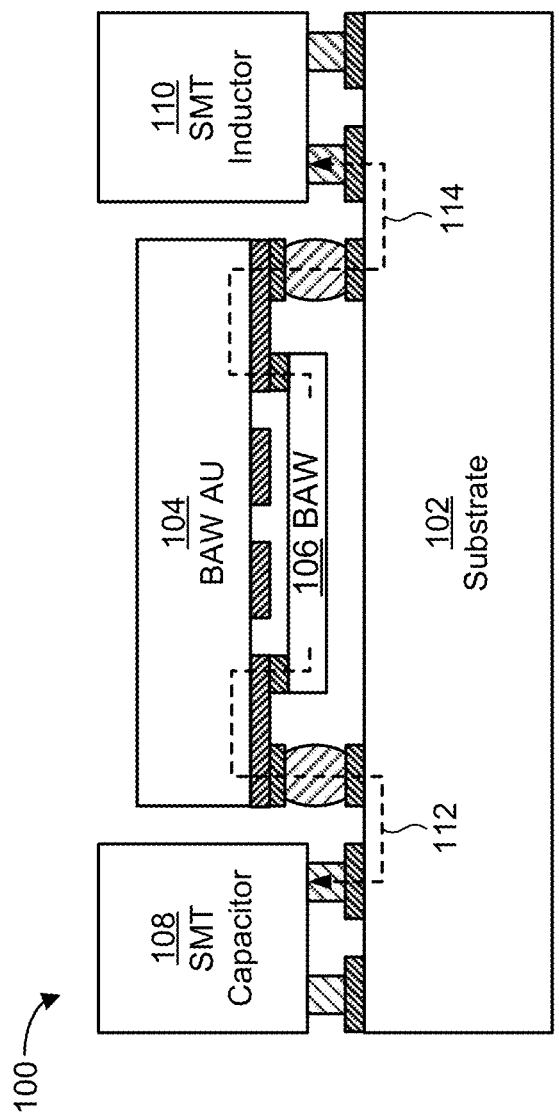
FIG. 1 a side cross-sectional view of an apparatus that includes a conventional implementation of a BAW filter.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

A compact hybrid integrated filter structure with LC (inductor and capacitor) and acoustic wave resonators is disclosed. In an aspect an apparatus comprises a substrate; a first, multi-layer metallization structure disposed above the substrate; a plurality of pillar structures disposed above, and electrically coupled to, the first metallization structure; a second metallization structure disposed above, an electrically coupled to, the plurality of pillar structures. An acoustic unit (AU) is disposed between the first and second metallization structures and adjacent to at least one of the pillar structures. The AU comprises a surface acoustic wave or bulk acoustic wave acoustic resonator that is electrically coupled to a capacitor and an inductor. The capacitor comprises a metal-insulation-metal capacitor that is formed from a portion of the first metallization structure and optionally also from at least one pillar structure and a portion of the second metallization structure. The inductor is comprised of a second portion of the first metallization structure.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

A broadband filter with a wide bandwidth and a sharp skirt rejection is desirable for high performance filters in the radio frequency (RF) frontend of a mobile device. Surface acoustic wave (SAW) and bulk acoustic wave (BAW) devices are well-suited for this purpose. FIG. 1 shows a current approach, in which an AU 104 having a BAW 106 (or SAW) device is used along with bulky SMT capacitors 108 and SMT inductors 110. Due to the long electrical paths 112 and 114 in FIG. 1, it is not feasible to shape or tune the AU resonator frequency using the SMT capacitor 108 and SMT inductor 110. Moreover, the conventional approach shown in FIG. 1 is bulky and requires space on the top surface of the substrate 102 for the AU 104, the SMT capacitor 108, and the SMT inductor 110.

In order to reduce the overall size of a conventional broadband filter and to provide the capability to shape or tune the AU resonator frequency, a compact hybrid acoustic wave filter structure is herein presented.

Figure 2:
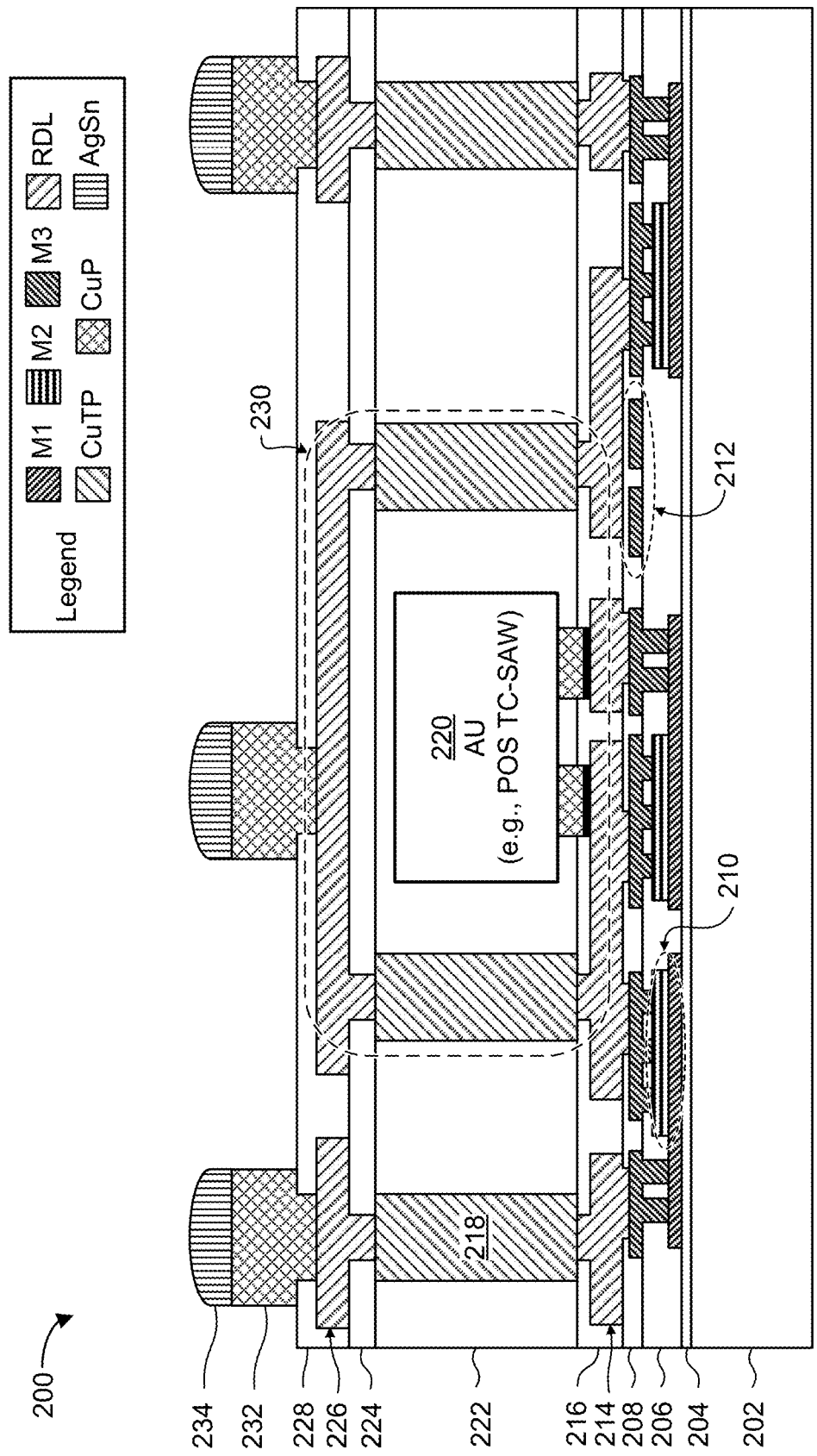
FIG. 2 is a side cross-sectional view of an apparatus that includes a compact hybrid integrated filter structure with LC and acoustic unit (aka hybrid acoustic wave filter) structure, according to aspects of the disclosure.

FIG. 2 is a side cross-sectional view of an apparatus 200 that includes a compact hybrid acoustic wave filter structure according to aspects of the disclosure. In the example illustrated in FIG. 2, the apparatus 200 includes a substrate 202. In some aspects, the substrate 202 comprises a hybrid integrated passive (HIP) substrate. In some aspects, the substrate 202 may comprise glass, GaAs, or other materials. In some aspects, the substrate 202 comprises a high resistivity substrate (HRS) and/or a high thermal conductivity substrate, such as an alumina ceramic substrate. An oxide layer 204 is on the top surface of the substrate 202. Above the oxide layer 204 is an intra-metal dielectric (IMD) layer 206, and above the EID layer 206 is a first passivation layer 208.

In the example illustrated in FIG. 2, the EID layer 206 and the first passivation layer 208 enclose a metallization structure comprising first metal (M1), second metal (M2), and third metal (M3) layers. In some aspects, the metallization structure may comprise a redistribution layer (RDL). In the example illustrated in FIG. 2, at least one metal-insulator-metal (MIM) capacitor 210 is formed from M1 and M2 structures separated by a dielectric material and electrically connected to other elements via M3 structures. In some aspects, some of the M3 structures may form one or more RDL inductors 212.

In the example illustrated in FIG. 2, the apparatus 200 includes a bottom RDL layer 214 above the first passivation layer 208 and enclosed by a second passivation layer 216. The apparatus 200 includes copper tall pillars (CuTP) 218 which flank an acoustic unit (AU) 220 that is positioned among the CuTPs 218. The CuTPs 218 and AU 220 are surrounded by an electronic molding compound (EMC) layer 222. In some aspects, the AU 220 comprises a piezoelectric-on-silicon (POS) or piezoelectric on insulator (POI) temperature compensated (TC) SAW.

In the example illustrated in FIG. 2, the apparatus 200 includes a third passivation layer 224 above the EMC layer 222. A top RDL layer 226 is disposed above the third passivation layer 224 and makes electrical contact to CuTPs 218 through vias in the third passivation layer 224. A fourth passivation layer 228 is disposed above the top RDL layer 226. In some aspects, the bottom RDL layer 214, CuTPs 218, and top RDL layer 226 may form one or more 3D solenoid inductors 230, which may surround or encircle the AU 220.

In the example illustrated in FIG. 2, the apparatus 200 includes one or more contacts 232, which make electrical contact with the top RDL layer 226 through vias in the fourth passivation layer 228. In some aspects, the contacts 232 may be topped with a conductive material 234, such as AgSn. In some aspects, the contacts 232 are copper pillars.

In some aspects, the apparatus 200 comprises a compact, hybrid, integrated broadband filter structure with a narrowband (NB) POS TC-SAW (i.e., part of AU 220) and a wideband (WB) high quality (HQ) inductor and capacitor (LC) resonator. In some aspects, the LC resonator comprises at least one MIM capacitor 210. In some aspects, the LC resonator comprises at least one RDL inductor 212 and/or at least one 3D solenoid inductor 230. In some aspects, the TC-SAW is a thin-film encapsulated (TFE) TC-SAW filter built on a POS substrate, subjected to a singulation process to produce a discrete AU 220 die that is die-to-wafer (D2W) flip-chip bonded (FCB) to the bottom RDL layer 214.

As shown in FIG. 2, the AU 220 an LC resonator components (e.g., MIM capacitor 210, RDL inductor 212, 3D solenoid inductor 230, etc.) is electrically coupled to contacts 232 via the bottom RDL 214, the CuTPs 218 surrounded by EMC 222, and the top RDL 226. The LC resonator components are physically (and electrically) close enough to the AU 220 to effectively shape the resonator waveform (tune the filter response). The combination of the reduced path length and the HQ LC resonator results in reduced insertion loss (IL) compared with the conventional apparatus 100. Moreover, the use of MIM capacitors and RDL or 3D inductors creates a very compact design compared to the conventional apparatus 100.

In some aspects, the use of a substrate 202 with high resistivity and/or high thermal conductivity (e.g., HRS, alumina ceramic, etc.) allows the apparatus to handle high power signals.

Figure 3:
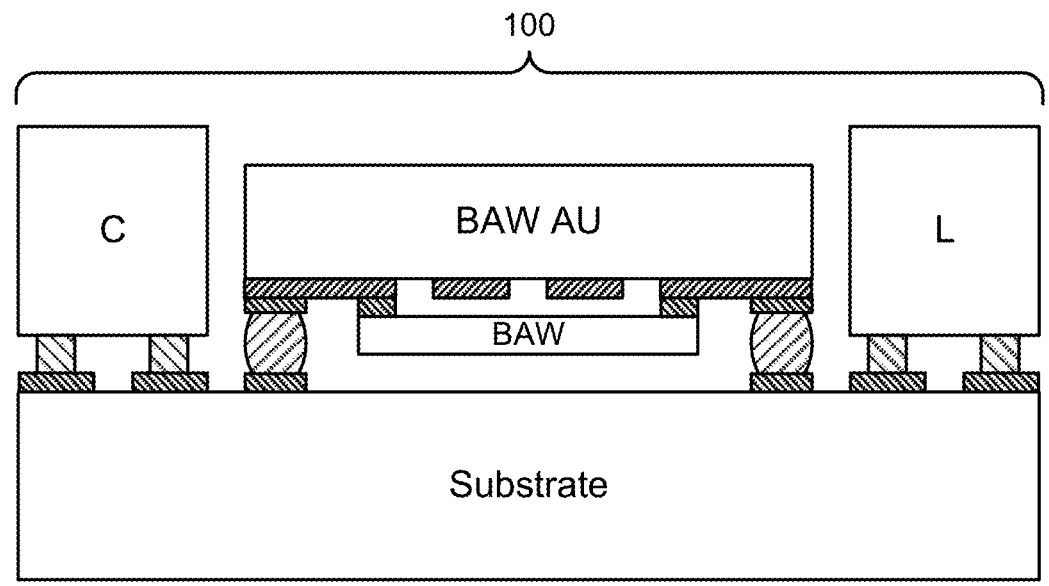
FIG. 3 illustrates the difference in size between a conventional acoustic wave filter structure 100 and a compact hybrid acoustic wave filter structure 200 according to aspects of the disclosure.
Figure 3:
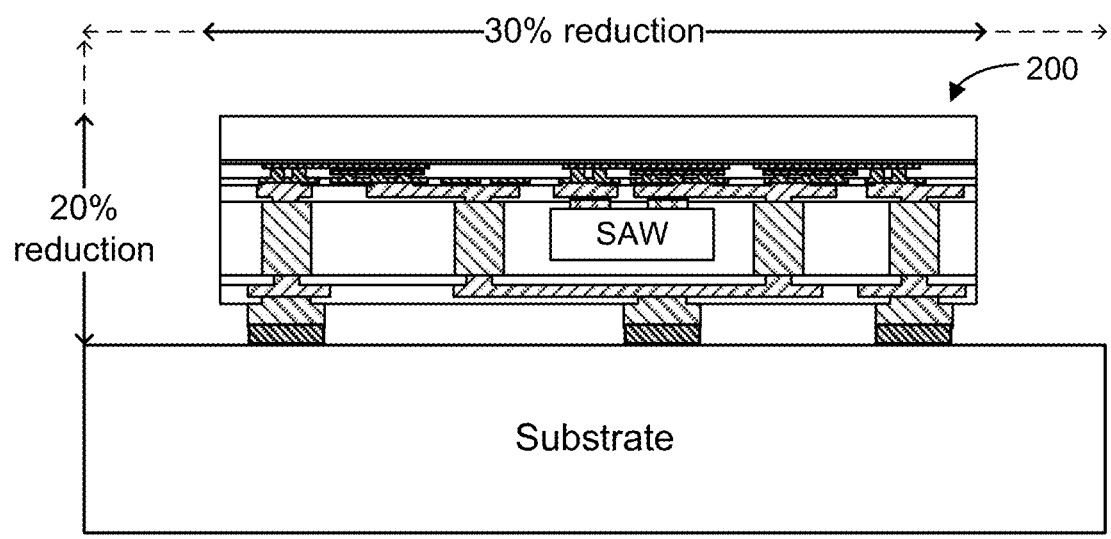

FIG. 3 illustrates the difference in size between a conventional acoustic wave filter structure 100 and a compact hybrid acoustic wave filter structure 200 according to aspects of the disclosure. Among the various technical advantages provided by the various aspects, in at least some aspects, the compact hybrid acoustic wave filter structure 200 has reduced size and/or improved performance. In one comparison, the compact hybrid acoustic wave filter structure 200 had XY dimensions that were 30% smaller than the conventional structure 100 and had a Z dimension that was 20% smaller than the conventional structure 100. Moreover, the compact hybrid acoustic wave filter structure 200 had a 1.5-2.0 dB performance improvement over the conventional structure 100, and a 10-20% improvement in thermal performance compared to the conventional structure 100. In addition, the compact hybrid acoustic wave filter structure 200 had an assembly cost that was 20% smaller than the assembly cost of the conventional structure 100.

Figure 4A:
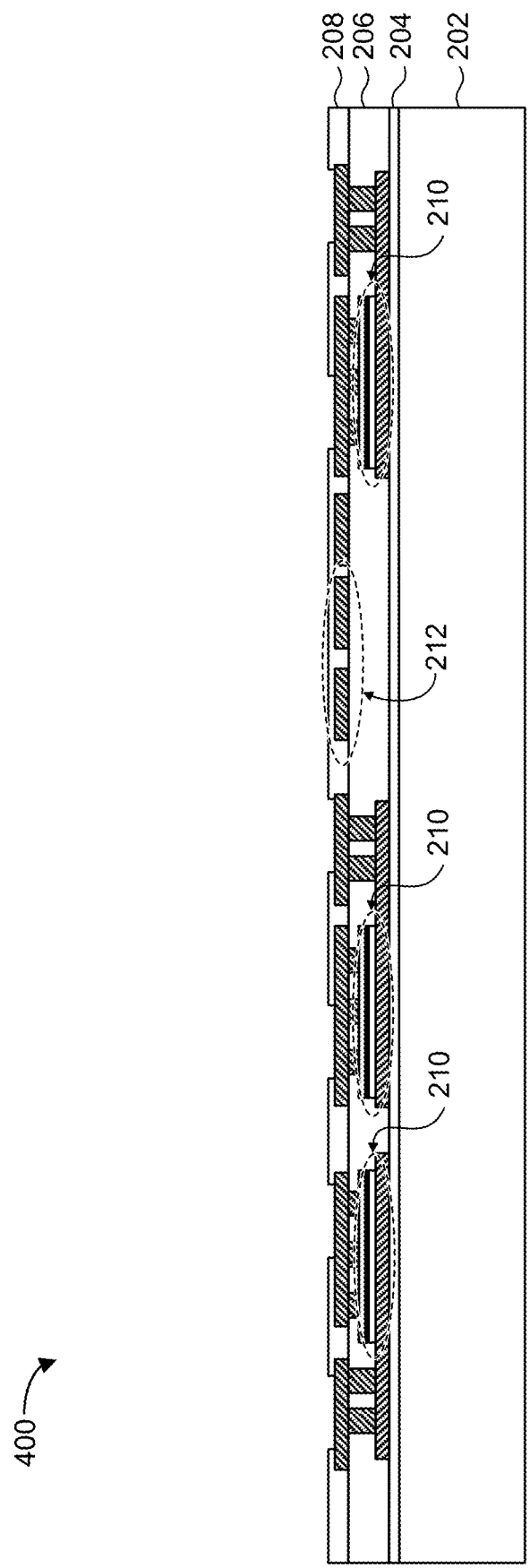
FIG. 4A through FIG. 4M illustrate portions of a wafer process for fabricating a compact hybrid acoustic wave filter structure, according to aspects of the disclosure.

FIG. 4A through FIG. 4M illustrate portions of a wafer process for fabricating a compact hybrid acoustic wave filter structure 400, according to aspects of the disclosure. FIG. 4A illustrates an HIP IPD substrate 202 upon which has been fabricated an oxide layer 204, an IMD layer 206, and a first passivation layer 208. In some aspects, the first passivation layer 208 may be fabricated using a spin coating, or thick dielectric deposition following by CMP (chemical-mechanical polish). The IMD layer 206 encloses at least one MIM capacitor 210, and the first passivation layer 208 encloses at least one RDL inductor 212.

In FIG. 4A, the first passivation layer 208 has been etched with openings to provide electrical connections to the metal layer within the first passivation layer 208 (e.g., M3 in this example).

Figure 4B:
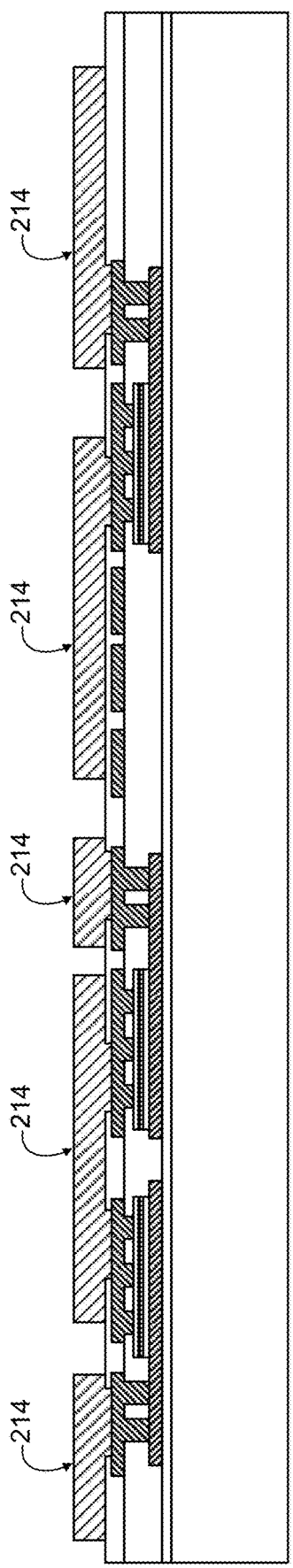

As shown in FIG. 4B, the process may further include creating the bottom RDL layer 214 structures. In some aspects, this comprises a metal (e.g., copper) plating step followed by a seed layer etching step to create the structures.

Figure 4C:
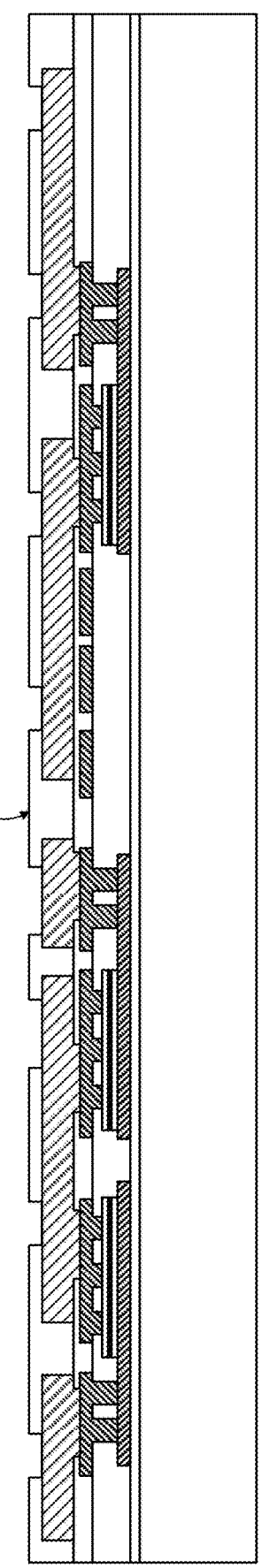

As shown in FIG. 4C, the process may further include providing the second passivation layer 216, e.g., an ILD coating of polyimide (PI), and photo-defined patterning of removal of the second passivation layer 216 with openings to provide electrical connections to one or more of the bottom RDL layer 214 structures.

Figure 4D:
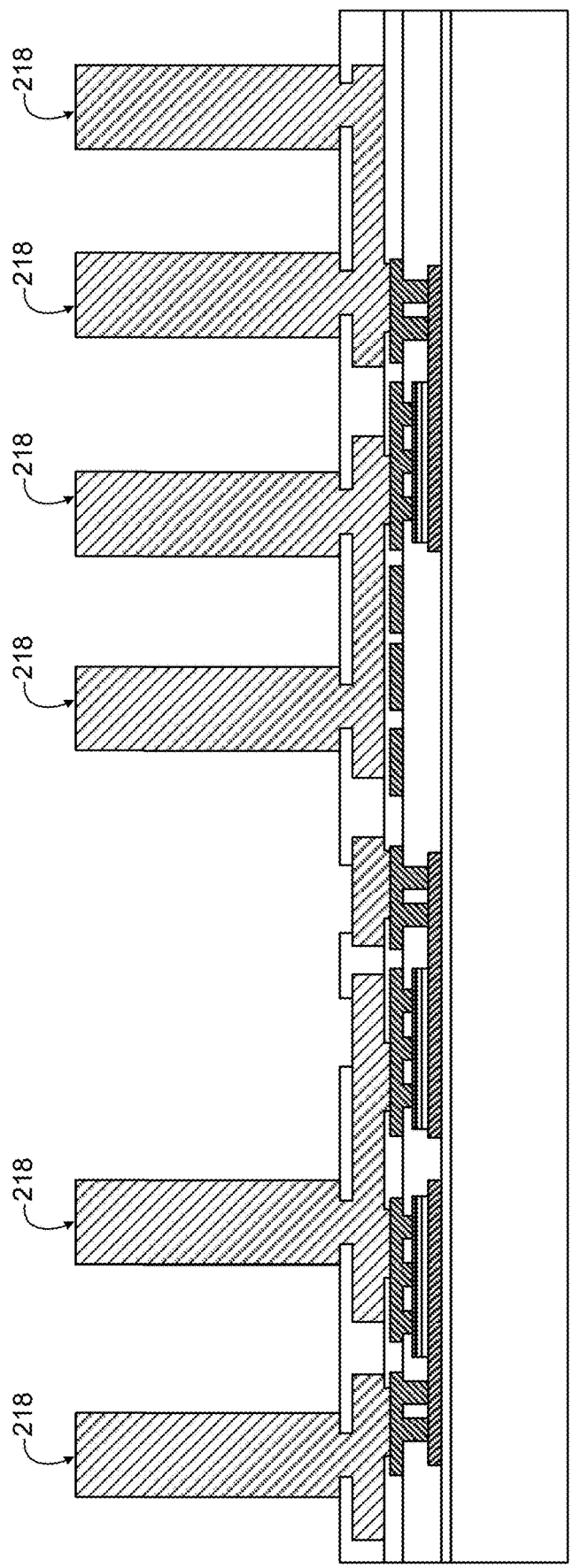

As shown in FIG. 4D, the process may further include creating pillar structures 218. In some aspects, this comprises one or more plating steps. In some aspects, the pillar structures 218 comprises copper tall pillar (CuTP) structures.

Figure 4E:
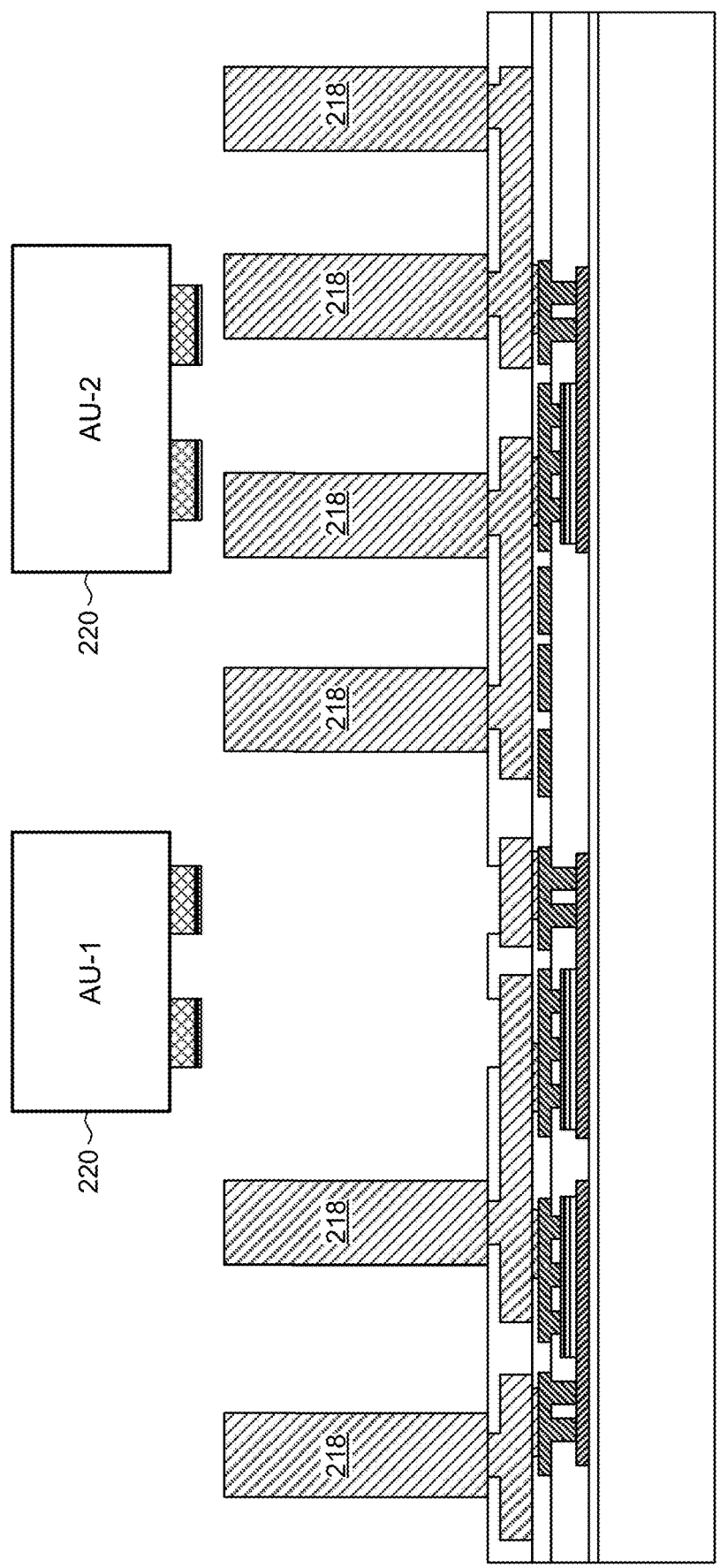

As shown in FIG. 4E, the process may further include mounting pre-fabricated AUs 220 to the apparatus. In the example shown in FIG. 4E, two AUs 220, labeled AU-1 and AU-2, are to be mounted.

Figure 4F:
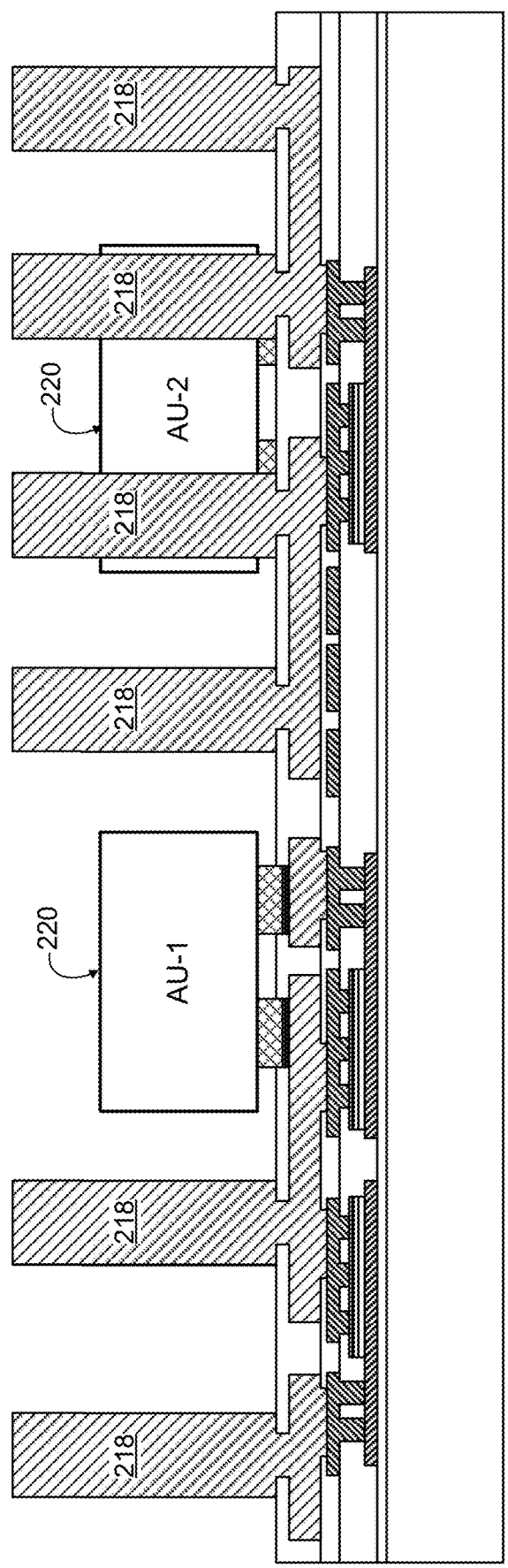

FIG. 4F shows the apparatus 400 after the AUs 220 are mounted. Both AUs 220 are mounted such that electrical connectors on the bottom surface of the AU 220 makes electrical contact with the bottom RDL layer 214. In the example shown in FIG. 4F, AU-1 and AU-2 are located among the CuTPs 218, with AU-2 behind some of the CuTPs 218.

Figure 4G:
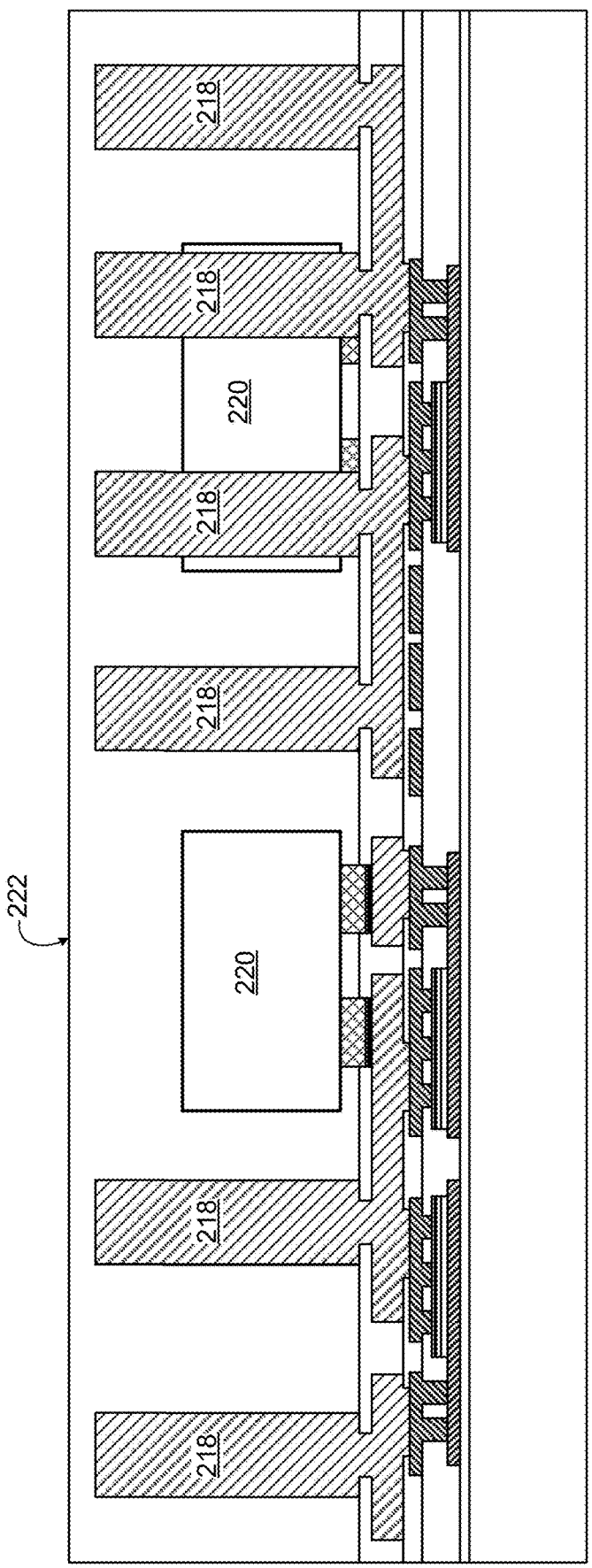

As shown in FIG. 4G, the process may further include adding an EMC 222 that surrounds and covers the CuTPs 218 and AUs 220.

Figure 4H:
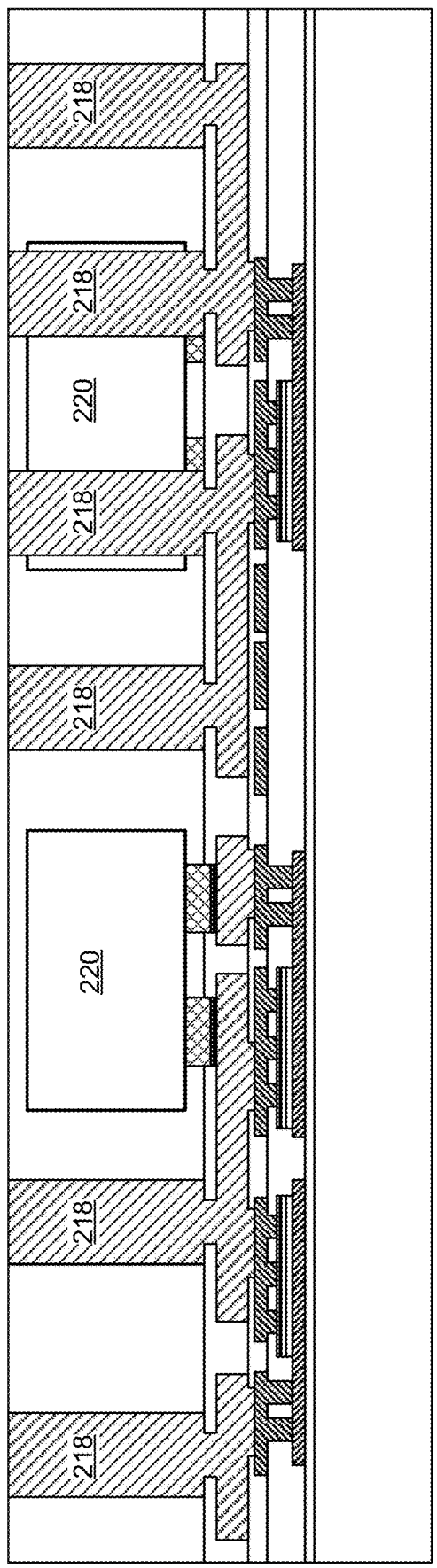

As shown in FIG. 4H, the process may further include co-grinding the CuTPs 218 and the EMC 222 to expose the CuTPs 218 for electrical contact.

Figure 4I:
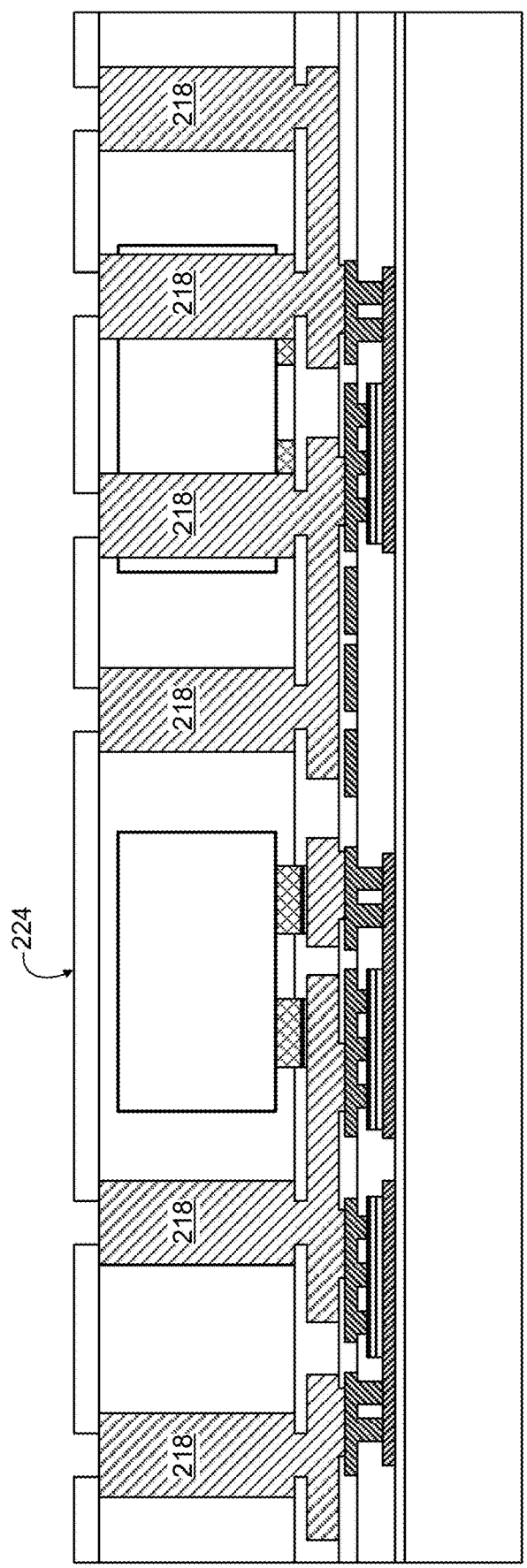

As shown in FIG. 4I, the process may further include applying a third passivation layer 224 and etching it to allow electrical connections to the CuTPs 218. In some aspects, the third passivation layer 224 may comprise an ILD.

Figure 4J:
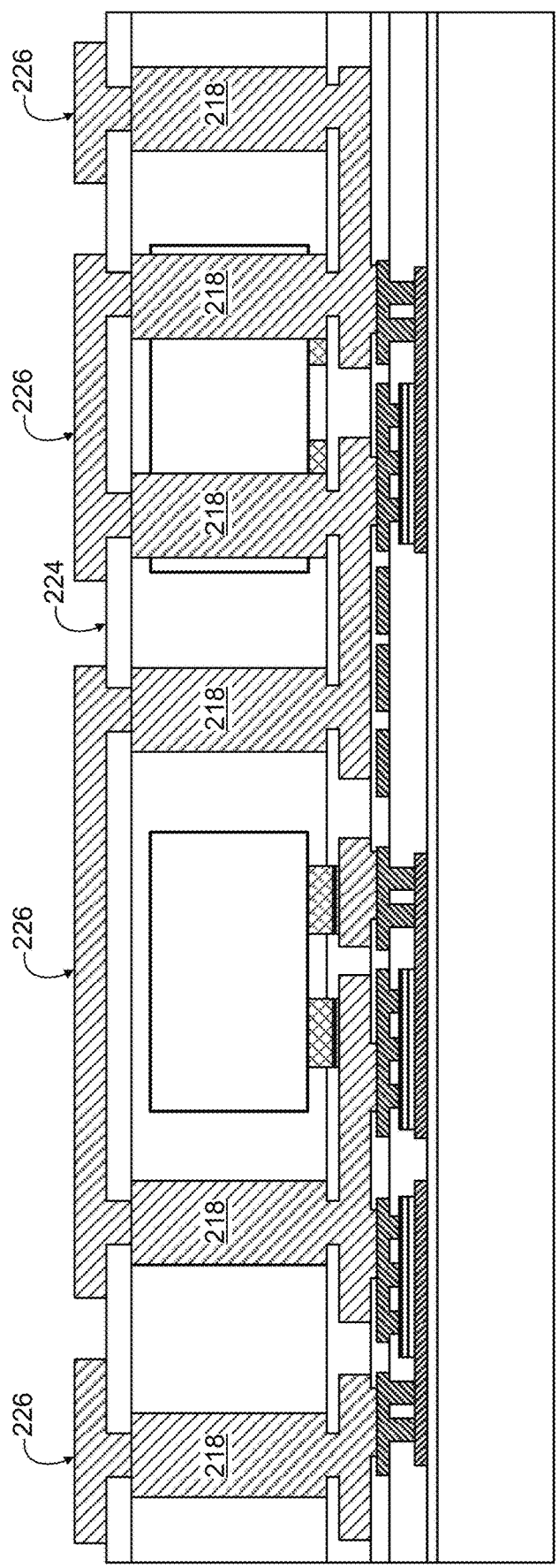

As shown in FIG. 4J, the process may further include depositing a top RDL layer 226, which makes electrical contact with the CuTPs 218 through vias in the third passivation layer 224. In some aspects, the top RDL layer 226 may comprise copper. In some aspects, the top RDL layer 226 may be plated.

Figure 4K:
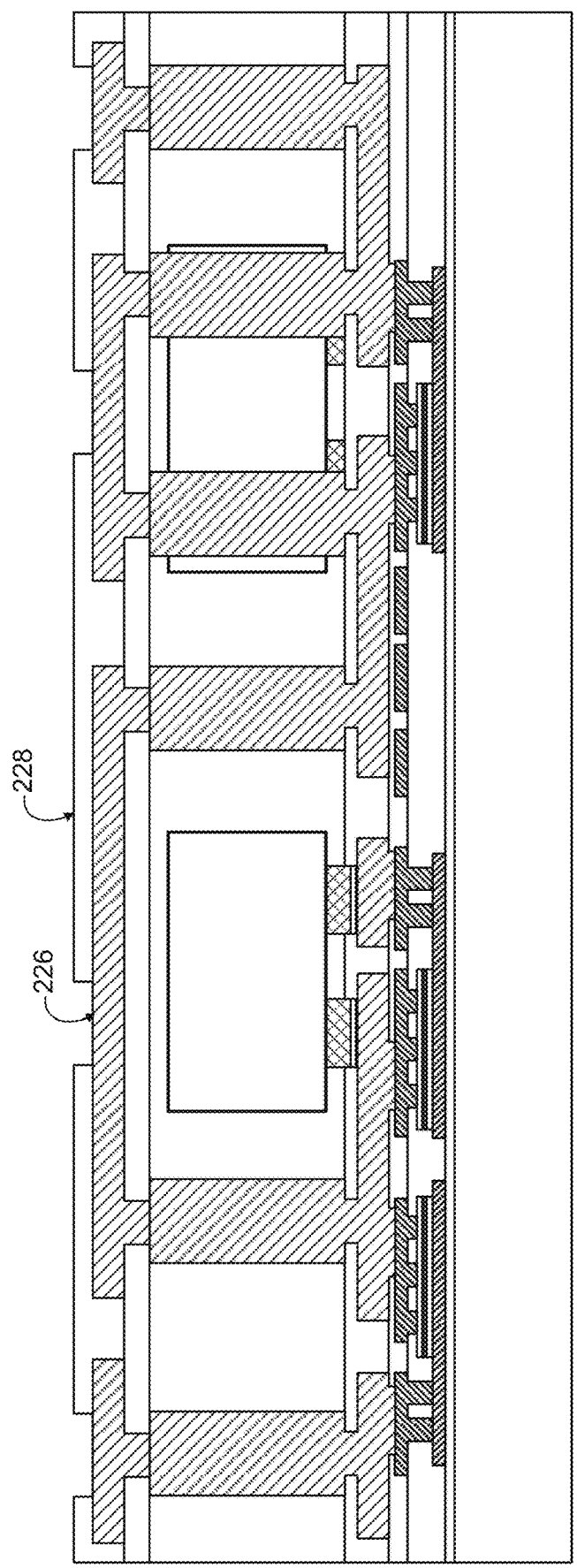

As shown in FIG. 4K, the process may further include depositing a fourth passivation layer 228 and etching it to allow electrical connections to the top RDL layer 226. In some aspects, the fourth passivation layer 228 may comprise an ILD.

Figure 4L:
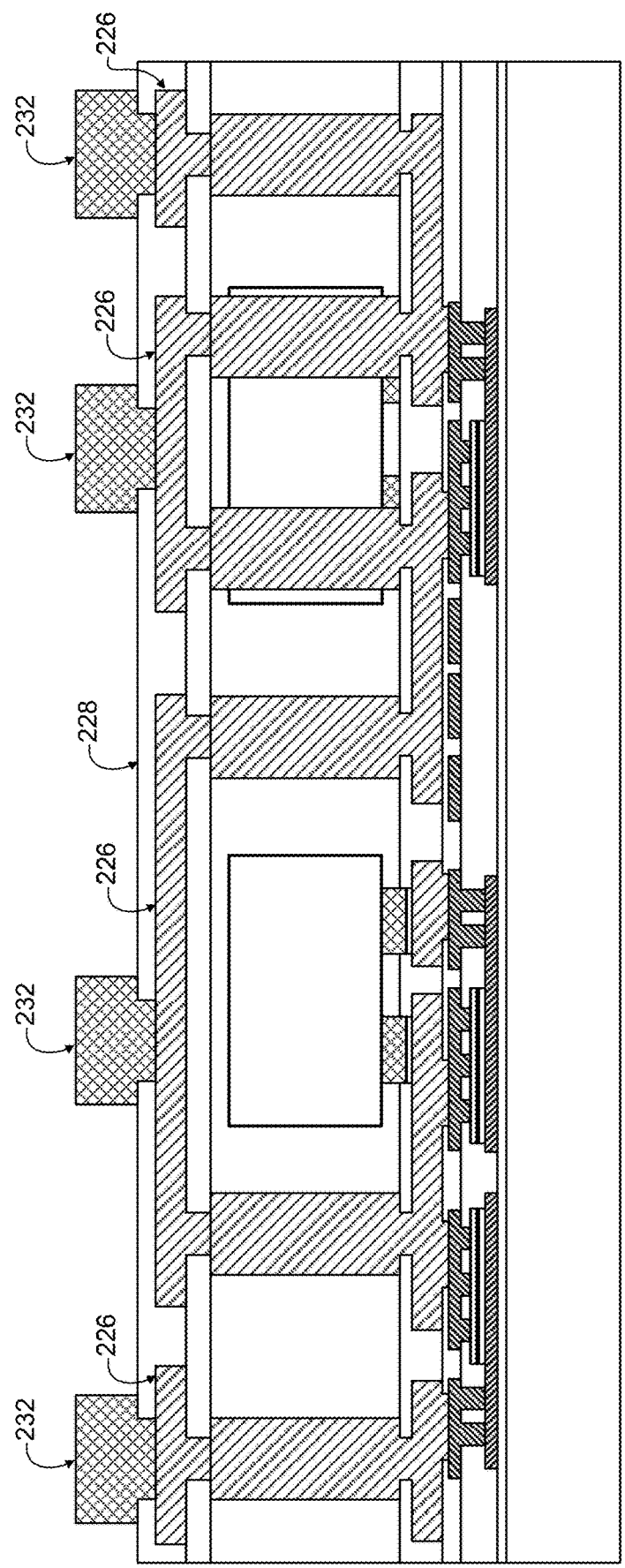

As shown in FIG. 4L, the process may further include providing one or more contacts 232 that are electrically connected to the top RDL layer 226 through vias in the fourth passivation layer 228. In some aspects, the contacts 232 may comprise copper. In some aspects, the contacts 232 may comprise pillars, C4 structures, land grid arrays (LGA), wafer-level packaging (WLP) balls, or other contact structure.

Figure 4M:
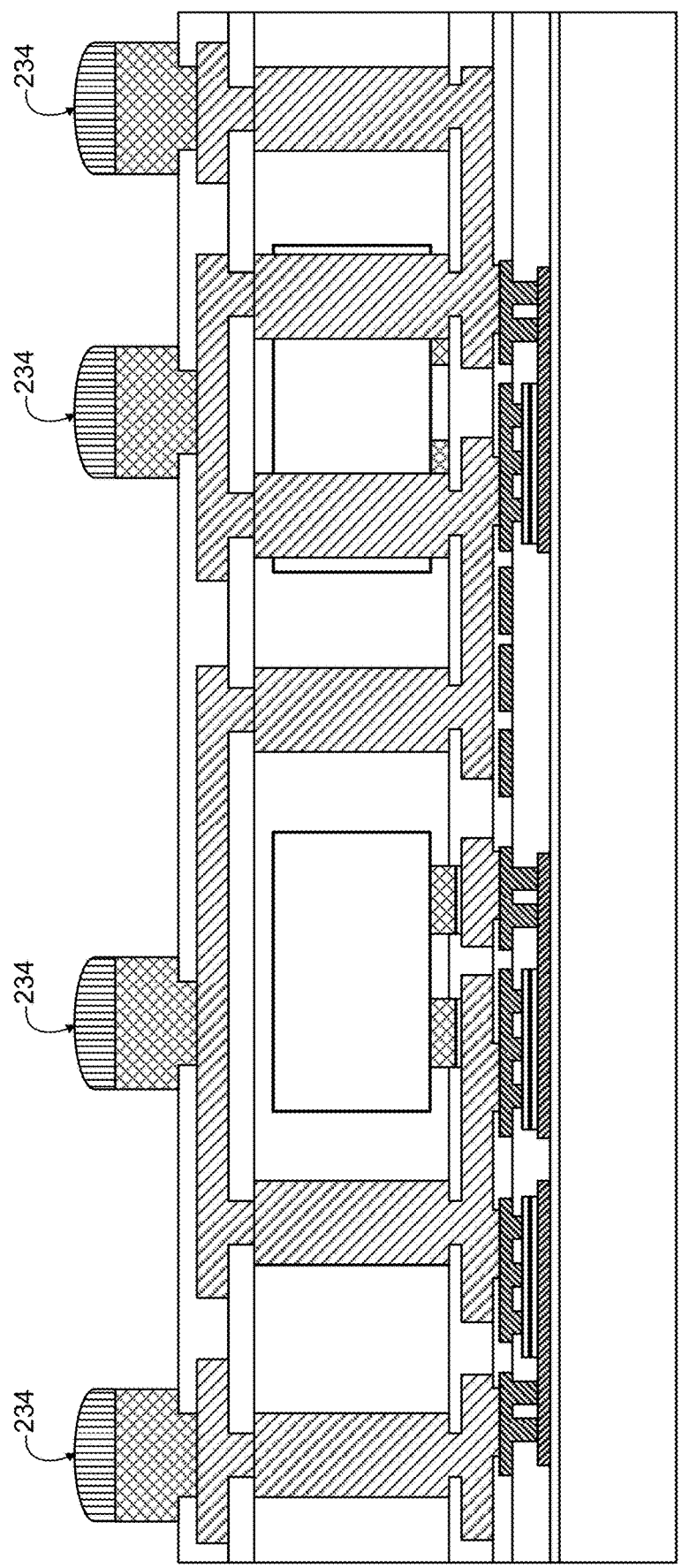

As shown in FIG. 4M, the process may further include topping the contacts 232 with another conducting material 234, such as AgSn or other conducting material.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 5:
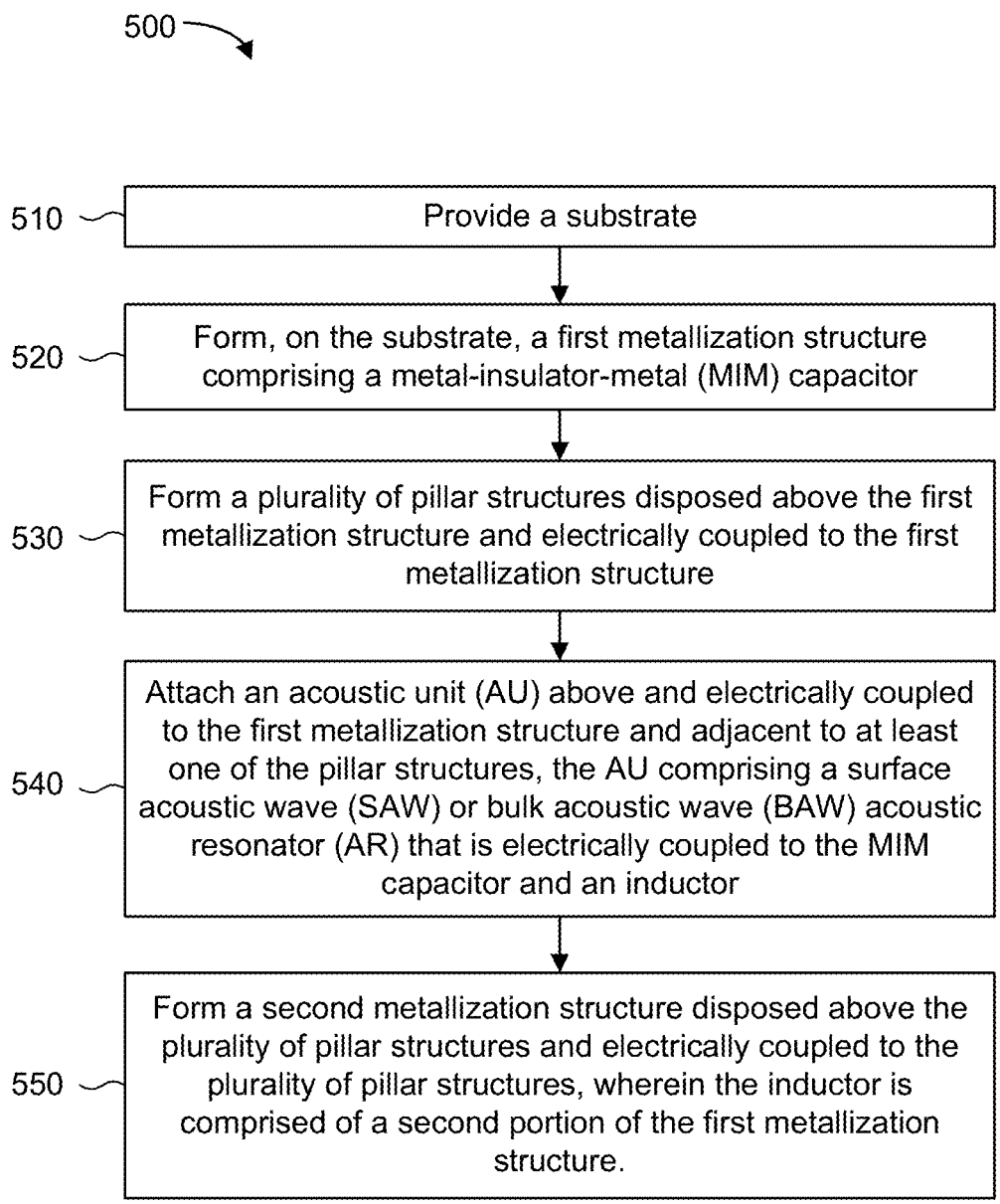
FIG. 5 is a flowchart 500 illustrating steps of an exemplary process for fabricating a compact hybrid acoustic wave filter structure, according to aspects of the disclosure.

FIG. 5 is a flowchart 500 of an example process for fabricating a compact hybrid acoustic wave filter structure, according to aspects of the disclosure. As shown in FIG. 5, the process may include providing a substrate (block 510). As further shown in FIG. 5, the process may include forming, on the substrate, a first metallization structure comprising a metal-insulator-metal (MIM) capacitor (block 520). As further shown in FIG. 5, the process may include forming a plurality of pillar structures disposed above the first metallization structure and electrically coupled to the first metallization structure (block 530). As further shown in FIG. 5, the process may include attaching an acoustic unit (AU) above and electrically coupled to the first metallization structure and adjacent to at least one of the pillar structures, the AU comprising a surface acoustic wave (SAW) or bulk acoustic wave (BAW) acoustic resonator (AR) that is electrically coupled to the MIM capacitor and an inductor (block 540). As further shown in FIG. 5, the process may include forming a second metallization structure disposed above the plurality of pillar structures and electrically coupled to the plurality of pillar structures, wherein the inductor is comprised of a second portion of the first metallization structure (block 550).

In some aspects, the inductor is further comprised of at least one of the plurality of pillar structures and a third portion of the second metallization structure.

In some aspects, forming the plurality of pillar structures comprises using a plating step.

In some aspects, forming the plurality of pillar structures comprises forming a plurality of copper tall pillars (CuTPs).

In some aspects, the process includes providing an insulating material disposed between the first metallization structure and the second metallization structure and surrounding the plurality of pillar structures and the AU.

In some aspects, providing the insulating material comprises providing an electronic molding compound.

In some aspects, forming at least one of the first metallization structure and the second metallization structure comprises forming a redistribution layer (RDL).

In some aspects, attaching the AU comprises attaching a piezoelectric-on-silicon (POS) or piezoelectric-on-insulator (POI) device.

In some aspects, attaching the AU comprises attaching a thin-film encapsulated (TFE) package structure.

In some aspects, attaching the AU comprises attaching a flip-chip device that is electrically connected to the first metallization structure.

In some aspects, the AU, the capacitor, and the inductor are components of a broadband filter.

In some aspects, providing the substrate comprises providing a substrate with high resistivity, high thermal conductivity, or both.

The process may include additional implementations, such as any single implementation or any combination of implementations described below and/or in connection with one or more other processes described elsewhere herein. Although FIG. 5 shows example blocks of the process, in some implementations, the process may include additional blocks, fewer blocks, different blocks, or differently arranged blocks than those depicted in FIG. 5. Additionally, or alternatively, two or more of the blocks of the process may be performed in parallel.

Figure 6:
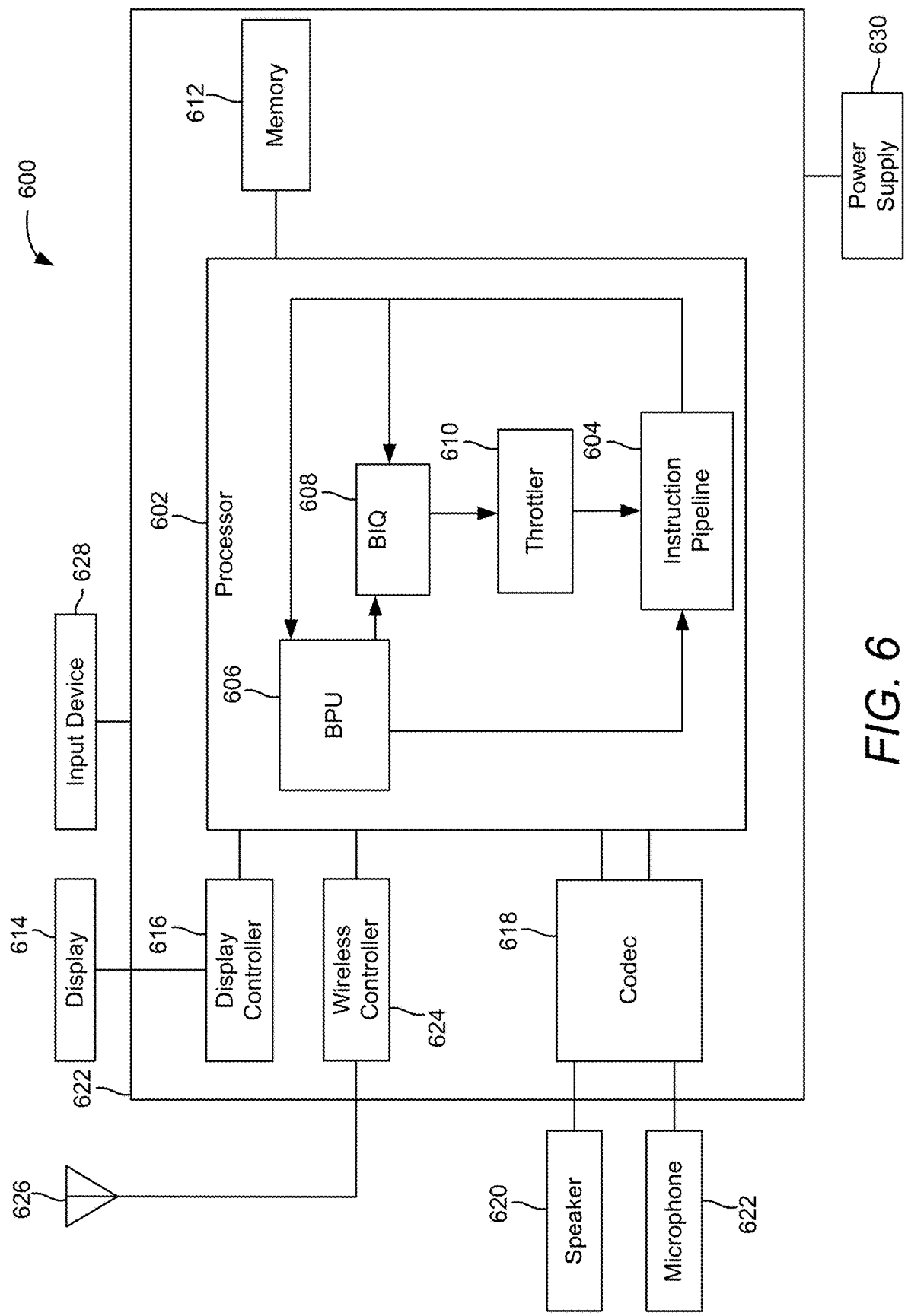
FIG. 6 illustrates an exemplary mobile device in accordance with one or more aspects of the disclosure.

FIG. 6 illustrates an exemplary mobile device in accordance with some examples of the disclosure. Referring now to FIG. 6, a block diagram of a mobile device that is configured according to exemplary aspects is depicted and generally designated mobile device 600.

In some aspects, mobile device 600 may be configured as a wireless communication device. As shown, mobile device 600 includes processor 602. Processor 602 is shown to comprise instruction pipeline 604, buffer processing unit (BPU) 606, branch instruction queue (BIQ) 608, and throttler 610 as is well known in the art. Other well-known details (e.g., counters, entries, confidence fields, weighted sum, comparator, etc.) of these blocks have been omitted from this view of processor 602 for the sake of clarity. Processor 602 may be communicatively coupled to memory 612 over a link, which may be a die-to-die or chip-to-chip link. Mobile device 600 also includes display 614 and display controller 616, with display controller 616 coupled to processor 602 and to display 614.

In some aspects, FIG. 6 may include coder/decoder (CODEC) 618 (e.g., an audio and/or voice CODEC) coupled to processor 602; speaker 620 and microphone 622 coupled to CODEC 618; and wireless controller circuits 624 (which may include a modem, radio frequency (RF) circuitry, filters, etc., which may be implemented using one or more flip-chip devices, as disclosed herein) coupled to wireless antenna 626 and to processor 602.

In a particular aspect, where one or more of the above-mentioned blocks are present, processor 602, display controller 616, memory 612, CODEC 618, and wireless controller circuits 624 can be included in a system-in-package or system-on-chip device, which may be implemented in whole or part using the techniques disclosed herein. Input device 628 (e.g., physical or virtual keyboard), power supply 630 (e.g., battery), display 614, input device 628, speaker 620, microphone 622, wireless antenna 626, and power supply 630 may be external to the system-on-chip device and may be coupled to a component of the system-on-chip device, such as an interface or a controller.

It should be noted that although FIG. 6 depicts a mobile device, the processor 602 and memory 612 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
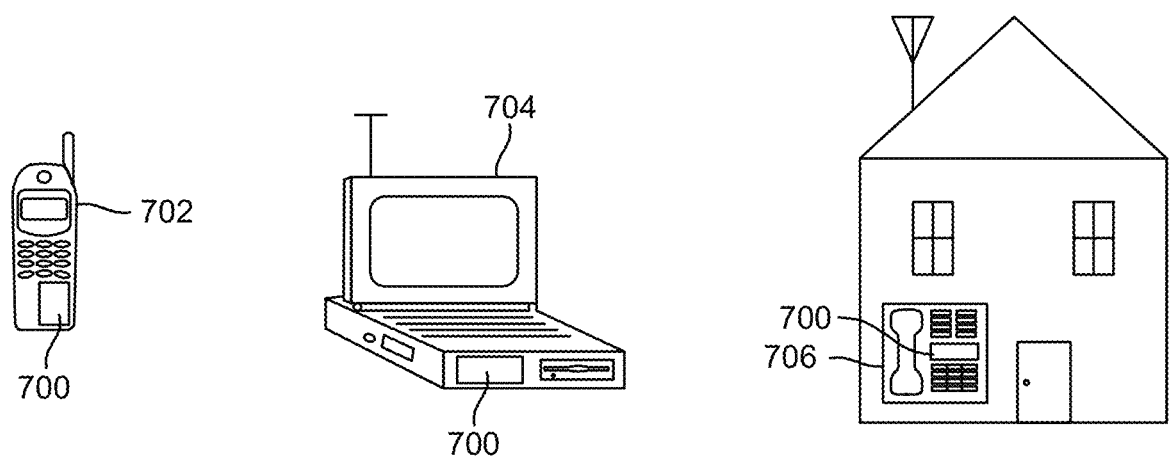
FIG. 7 illustrates various electronic devices that may be integrated with any of the aforementioned integrated device or semiconductor device in accordance with one or more aspects of the disclosure.

FIG. 7 illustrates various electronic devices that may be integrated with any of the aforementioned integrated device or semiconductor device accordance with various examples of the disclosure. For example, a mobile phone device 702, a laptop computer device 704, and a fixed location terminal device 706 may each be considered generally user equipment (UE) and may include a device 700 as described herein, for example. The device may be, for example, any of the integrated circuits, dies, integrated devices, integrated device packages, integrated circuit devices, device packages, integrated circuit (IC) packages, package-on-package devices described herein. The mobile phone device 702, laptop computer device 704, and fixed location terminal device 706 illustrated in FIG. 7 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. An apparatus comprising: a substrate; a first metallization structure disposed above the substrate, the first metallization structure comprising a plurality of metal layers; a plurality of pillar structures disposed above the first metallization structure and electrically coupled to the first metallization structure; a second metallization structure disposed above the plurality of pillar structures and electrically coupled to the plurality of pillar structures; and an acoustic unit (AU) disposed above the first metallization structure, below the second metallization structure, and adjacent to at least one of the pillar structures, the AU comprising a surface acoustic wave (SAW) or bulk acoustic wave (BAW) acoustic resonator (AR) that is electrically coupled to a capacitor and an inductor, wherein the capacitor comprises a metal-insulation-metal (MIM) capacitor that is comprised of a first portion of the first metallization structure, and wherein the inductor is comprised of a second portion of the first metallization structure.

Clause 2. The apparatus of clause 1, wherein the inductor is further comprised of at least one of the plurality of pillar structures and a third portion of the second metallization structure.

Clause 3. The apparatus of any of clauses 1 to 2, wherein the plurality of pillar structures comprise copper tall pillars (CuTPs).

Clause 4. The apparatus of any of clauses 1 to 3, wherein the plurality of pillar structures and the AU are surrounded by an insulating material disposed between the first metallization structure and the second metallization structure.

Clause 5. The apparatus of clause 4, wherein the insulating material comprises an electronic molding compound.

Clause 6. The apparatus of any of clauses 1 to 5, wherein at least one of the first metallization structure and the second metallization structure comprises a redistribution layer (RDL).

Clause 7. The apparatus of any of clauses 1 to 6, wherein the AU comprises a piezoelectric-on-silicon (POS) or piezoelectric-on-insulator (POI) device.

Clause 8. The apparatus of any of clauses 1 to 7, wherein the AU comprises a thin-film encapsulated (TFE) package structure.

Clause 9. The apparatus of any of clauses 1 to 8, wherein the AU comprises a flip-chip device that is electrically connected to the first metallization structure.

Clause 10. The apparatus of any of clauses 1 to 9, wherein the AU, the capacitor, and the inductor are components of a broadband filter.

Clause 11. The apparatus of any of clauses 1 to 10, wherein the substrate comprises a substrate with high resistivity, high thermal conductivity, or both.

Clause 12. The apparatus of any of clauses 1 to 11, wherein the capacitor and the inductor comprise a high-Q resonator.

Clause 13. The apparatus of any of clauses 1 to 12, wherein the capacitor and the inductor shape a waveform of the AR, tune a filter response of the AR, or both.

Clause 14. The apparatus of any of clauses 1 to 13, wherein the apparatus is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 15. A method for fabricating an apparatus, the method comprising: providing a substrate; forming, on the substrate, a first metallization structure comprising a metal-insulator-metal (MIM) capacitor; forming a plurality of pillar structures disposed above the first metallization structure and electrically coupled to the first metallization structure; attaching an acoustic unit (AU) above and electrically coupled to the first metallization structure and adjacent to at least one of the pillar structures, the AU comprising a surface acoustic wave (SAW) or bulk acoustic wave (BAW) acoustic resonator (AR) that is electrically coupled to the MIM capacitor and an inductor; and forming a second metallization structure disposed above the plurality of pillar structures and electrically coupled to the plurality of pillar structures, wherein the inductor is comprised of a second portion of the first metallization structure.

Clause 16. The method of clause 15, wherein the inductor is further comprised of at least one of the plurality of pillar structures and a third portion of the second metallization structure.

Clause 17. The method of any of clauses 15 to 16, wherein forming the plurality of pillar structures comprises using a plating step.

Clause 18. The method of any of clauses 15 to 17, wherein forming the plurality of pillar structures comprises forming a plurality of copper tall pillars (CuTPs).

Clause 19. The method of any of clauses 15 to 18, further comprising providing an insulating material disposed between the first metallization structure and the second metallization structure and surrounding the plurality of pillar structures and the AU.

Clause 20. The method of clause 19, wherein providing the insulating material comprises providing an electronic molding compound.

Clause 21. The method of any of clauses 15 to 20, wherein forming at least one of the first metallization structure and the second metallization structure comprises forming a redistribution layer (RDL).

Clause 22. The method of any of clauses 15 to 21, wherein attaching the AU comprises attaching a piezoelectric-on-silicon (POS) or piezoelectric-on-insulator (POI) device.

Clause 23. The method of any of clauses 15 to 22, wherein attaching the AU comprises attaching a thin-film encapsulated (TFE) package structure.

Clause 24. The method of any of clauses 15 to 23, wherein attaching the AU comprises attaching a flip-chip device that is electrically connected to the first metallization structure.

Clause 25. The method of any of clauses 15 to 24, wherein the AU, the capacitor, and the inductor are components of a broadband filter.

Clause 26. The method of any of clauses 15 to 25, wherein providing the substrate comprises providing a substrate with high resistivity, high thermal conductivity, or both.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus comprising:
  a substrate;
  a first metallization structure disposed above the substrate, the first metallization structure comprising a plurality of metal layers;
  a plurality of pillar structures disposed above the first metallization structure and electrically coupled to the first metallization structure;
  a second metallization structure disposed above the plurality of pillar structures and electrically coupled to the plurality of pillar structures; and
  an acoustic unit (AU) disposed above the first metallization structure, below the second metallization structure, and adjacent to at least one of the pillar structures of the plurality of pillar structures, the AU comprising a surface acoustic wave (SAW) or bulk acoustic wave (BAW) acoustic resonator (AR) that is electrically coupled to a capacitor and an inductor, wherein the capacitor comprises a metal-insulation-metal (MIM) capacitor that is comprised of a first portion of the first metallization structure, wherein the inductor is comprised of a second portion of the first metallization structure, and wherein the capacitor and the inductor comprise a high-Q resonator.

2. The apparatus of claim 1, wherein the inductor is further comprised of at least one of the plurality of pillar structures and a third portion of the second metallization structure.

3. The apparatus of claim 1, wherein the plurality of pillar structures comprise copper tall pillars (CuTPs).

4. The apparatus of claim 1, wherein the plurality of pillar structures and the AU are surrounded by an insulating material disposed between the first metallization structure and the second metallization structure.

5. The apparatus of claim 4, wherein the insulating material comprises an electronic molding compound.

6. The apparatus of claim 1, wherein at least one of the first metallization structure and the second metallization structure comprises a redistribution layer (RDL).

7. The apparatus of claim 1, wherein the AU comprises a piezoelectric-on-silicon (POS) or piezoelectric-on-insulator (POI) device.

8. The apparatus of claim 1, wherein the AU comprises a thin-film encapsulated (TFE) package structure.

9. The apparatus of claim 1, wherein the AU comprises a flip-chip device that is electrically connected to the first metallization structure.

10. The apparatus of claim 1, wherein the AU, the capacitor, and the inductor are components of a broadband filter.

11. The apparatus of claim 1, wherein the substrate comprises a substrate with high resistivity, high thermal conductivity, or both.

12. The apparatus of claim 1, wherein the apparatus is incorporated into another apparatus selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

13. The apparatus of claim 1, wherein the capacitor and the inductor shape a waveform of the AR, tune a filter response of the AR, or both.

14. A method for fabricating an apparatus, the method comprising:

providing a substrate;

forming, on the substrate, a first metallization structure comprising a metal-insulator-metal (MIM) capacitor;

forming a plurality of pillar structures disposed above the first metallization structure and electrically coupled to the first metallization structure;

attaching an acoustic unit (AU) above and electrically coupled to the first metallization structure and adjacent to at least one of the pillar structures of the plurality of pillar structures, the AU comprising a surface acoustic wave (SAW) or bulk acoustic wave (BAW) acoustic resonator (AR) that is electrically coupled to the MIM capacitor and an inductor; and forming a second metallization structure disposed above the plurality of pillar structures and electrically coupled to the plurality of pillar structures, wherein the inductor is comprised of a second portion of the first metallization structure, and wherein the MIM capacitor and the inductor comprise a high-Q resonator.

15. The method of claim 14, wherein providing the substrate comprises providing a substrate with high resistivity, high thermal conductivity, or both.

16. The method of claim 14, wherein the inductor is further comprised of at least one of the plurality of pillar structures and a third portion of the second metallization structure.

17. The method of claim 14, wherein forming the plurality of pillar structures comprises using a plating step.

18. The method of claim 14, wherein forming the plurality of pillar structures comprises forming a plurality of copper tall pillars (CuTPs).

19. The method of claim 14, further comprising providing an insulating material disposed between the first metallization structure and the second metallization structure and surrounding the plurality of pillar structures and the AU.

20. The method of claim 19, wherein providing the insulating material comprises providing an electronic molding compound.

21. The method of claim 14, wherein forming at least one of the first metallization structure and the second metallization structure comprises forming a redistribution layer (RDL).

22. The method of claim 14, wherein attaching the AU comprises attaching a piezoelectric-on-silicon (POS) or piezoelectric-on-insulator (POI) device.

23. The method of claim 14, wherein attaching the AU comprises attaching a thin-film encapsulated (TFE) package structure.

24. The method of claim 14, wherein attaching the AU comprises attaching a flip-chip device that is electrically connected to the first metallization structure.

25. The method of claim 14, wherein the AU, the capacitor, and the inductor are components of a broadband filter.

* * * * *